(12) United States Patent
Tokushima

(10) Patent No.: US 6,315,819 B1
(45) Date of Patent: Nov. 13, 2001

(54) APPARATUS FOR MAKING EXHAUST GAS NON-TOXIC

(75) Inventor: Masatoshi Tokushima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/643,156

(22) Filed: Aug. 21, 2000

Related U.S. Application Data

(62) Division of application No. 08/968,979, filed on Nov. 12, 1999.

(30) Foreign Application Priority Data

Nov. 15, 1996 (JP) .................................................. 8-304629

(51) Int. Cl.⁷ ...................................................... B03C 1/00
(52) U.S. Cl. ........................................ 96/2; 96/3; 438/715
(58) Field of Search ................................ 96/2, 3; 438/715

(56) References Cited

U.S. PATENT DOCUMENTS 4,283,204 * 8/1981 Savage ........................................ 55/3

* cited by examiner

*Primary Examiner*—Edward J. Cain
(74) *Attorney, Agent, or Firm*—Hayes, Soloway, Hennessey, Grossman & Hage PC

(57) ABSTRACT

There is provided a method of dry etching a nickel film formed on a substrate by means of plasma of an etching gas, wherein the etching gas includes at least one of CO and $CO_2$ gases, and the substrate is designed to keep a temperature in the range of $-25°$ C. to $40°$ C. both inclusive, while the substrate is being etched. For instance, the etching gas is a mixture gas including CO and $CO_2$ gases, a mixture gas including CO, $CO_2$ and $H_2$ gases, or a mixture gas including CO and $H_2$ gases. The above-mentioned method provides higher etching accuracy, higher etching rate, and less etching damage in a substrate.

17 Claims, 9 Drawing Sheets

$S = \alpha / T$
T: ETCHING TIME

APPARATUS FOR MAKING EXHAUST GAS NON-TOXIC

This application is a Division of Ser. No. 08/968,979 filed Nov. 12, 1999.

BACKGROUND OF THE INVENTION

1. Field of the Invention

The invention relates to a method of dry etching, and more particularly to a method of dry etching a nickel film for making an electrode. The invention also relates to an apparatus of making dry etching exhaust gas non-toxic.

2. Description of the Related Art

There has been used various methods and apparatuses for dry etching of nickel in order to etch a nickel film with high accuracy to thereby form a electrode in a semiconductor device.

For instance, Japanese Unexamined Patent Publication No. 53-20769 has suggested a method of dry etching a nickel film by means of plasma generated from CO or $CO_2$ gas. The suggested method utilizes a method of refining metal, known as carbonyl process. Iwanami, Scientific and Chemical Encyclopedia, the 3rd edition, pp. 270 defines the word "carbonyl process" as follows: "This is a method of refining metal, utilizing thermal dissociation of metal carbonyl. Mond process for refining nickel is an example of the carbonyl process, and is based on the following equilibrium equation.

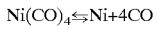

If nickel dioxide (II) were reduced to metal nickel with hydrogen gas, the thus reduced metal nickel were caused to react with CO at 60° C. to thereby produce gaseous nickel carbonyl, $Ni(CO)_4$ having a boiling point of 42.5° C., and then the thus produced gaseous nickel carbonyl were heated up to 180° C. in a decomposition tower, the above-mentioned equilibrium equation proceeds towards the right. As a result, there is obtained highly purified nickel in the form of powder, including CO in a small content."

As mentioned above, Ni can be etched merely by causing Ni to directly react with CO gas. The above-mentioned Japanese Unexamined Patent Publication No. 53-20769 further suggests a method of etching Ni by producing plasma of CO gas, but does not mention an advantage of producing plasma of CO gas.

When $CO_2$ gas is employed, $CO_2$ gas has to be turned into plasma ill order to etch Ni. This is because $CO_2$ gas is decomposed by being turned into plasma to thereby produce CO gas necessary for etching Ni.

By etching Ni with either CO or $CO_2$ gas, there can be obtained an advantage that it is no longer necessary to use chemicals which has a problem that waste solution thereof is quite difficult to properly dispose of.

Japanese Unexamined Patent Publication No. 60-228687 has suggested another method of dry etching nickel by using $CO_2$ plasma. The Publication mentions that a method of etching nickel at a temperature in the range of 40° C. to 100° C. by using CO gas has a shortcoming of poor etching accuracy relative to a mask pattern due to that etching is isotropic. In addition, the Publication further mentions that if plasma were generated based on CO gas, there would be generated $O_2$ gas which would oxidize nickel, and hence make it difficult to carry out nickel etching. As a solution to such a problem, the Publication has suggested the use of $CO_2$ plasma for etching nickel, and addition of $H_2$ to $CO_2$ gas for preventing oxidation of nickel.

Japanese Unexamined Patent Publication No. 60-228687 presents a graph showing a relation between a nickel etching rate and input power provided to a discharge electrode, which relation is found when nickel is etched by means of plasma of $CO_2$ gas. The graph is illustrated in FIG. 1. According to FIG. 1, an input power of about 150 W is required for obtaining an etching rate of 1000 angstroms/min., for instance.

For the purpose of dry etching nickel, there may be used a variety of etching apparatuses. For instance, there may be used a plane parallel plate type reactive ion etching (RIE) apparatus, an electron cyclotron resonant (ECR) etching apparatus, or an inducive coupling type plasma (ICP) etching apparatus.

FIG. 2 illustrates an exhaust system of those etching apparatuses. The exhaust system comprises an exhaust pump system 80 disposed downstream of an etching apparatus 79, and an apparatus 81 for making an exhaust gas non-toxic, disposed downstream of the exhaust pump system 80. The exhaust gas 98 made non-toxic by the apparatus 81 is released to atmosphere, or introduced to a gas scrubber (not illustrated) through an exhaust conduit 97. As illustrated in FIG. 2, the exhaust pump system 80 generally includes a booster pump or turbo-molecular pump 95, and a rotary pump employing oil for rotation or a dry pump 96 employing no oil for rotation, disposed downstream of the pump 95.

The etching apparatus 79 includes an etching chamber 88 having a gas inlet 85 through which etching gas 84 is introduced into the etching chamber 88. The etching chamber 88 is provided with a gate 83 which is designed to be open or closed by means of a gate valve 82. Inside the etching chamber 88 are disposed an anode 89 and a cathode 90. The anode 89 is supported in the etching chamber 88 with an insulator 86, and is grounded at 87. The cathode 90 is supported in the etching chamber 88 with an insulator 99 in the same fashion as the anode 89, and is electrically connected to RF power source 93 via a matching box 92. The RF power source 93 is grounded at 94. A substrate 91 on which a nickel film to be etched is formed is placed on the cathode 90.

However, the above-mentioned conventional methods of dry etching have problems as follows.

The first problem is that nickel is isotropically etched in accordance with any one of the conventional methods, causing side etching with the result of poor accuracy in nickel etching relative to a mask pattern. This is because that CO gas directly reacts with Ni, which causes isotropic etching, in a conventional method where Ni is etched with CO gas at 40° C. to 100° C.

In a method of dry etching Ni with plasma of CO gas without keeping a substrate at 40° C. or lower, a temperature of a substrate would be over 40° C. by ion radiation to the substrate while nickel is being etched. Thus, as a result, etching is carried out isotropically due to direct reaction of CO gas with Ni.

Similarly, in a method of dry etching Ni with plasma of $CO_2$ gas without keeping a substrate at 40° C. or lower, a temperature of a substrate would be over 40° C. by ion radiation to the substrate while nickel is being etched. As a result, etching is carried out isotropically due to direct reaction between CO generated by decomposition of $CO_2$ gas in plasma and Ni.

The second problem is that when nickel is etched with plasma singly of CO gas, excessive deposition is accumulated on a surface of a substrate, which causes reduction in a nickel etching rate, or in some cases, inability of nickel etching. The reason is as follows. In decomposition of $CO_2$ gas, there are found two stages. Namely, $CO_2$ gas is first decomposed into CO and O in the first stage, and CO is further decomposed into C and O in the second stage. To the contrary, in decomposition of CO gas, CO gas is decomposed directly into C and O. Hence, non-volatile carbon is generated in a greater amount than $CO_2$ gas, resulting in that deposition onto a substrate is generated in a greater amount.

The third problem is that plasma singly of CO gas and plasma singly of $CO_2$ gas could not etch nickel without causing a damage to an underlying substrate. The reason is as follows. If nickel is etched with plasma singly of CO gas or plasma singly of $CO_2$ gas, nickel is oxidized at a surface thereof by O or $O_2$ generated by decomposition of CO and $CO_2$. Hence, if input power were decreased in order to prevent an underlying substrate from being damaged due to ion radiation, it would be impossible to remove a surface oxidation film of nickel, and as a result nickel could not be etched.

If nickel is etched with plasma of $CO_2$ and $H_2$ gases, nickel tends not to be oxidized at a surface thereof, which avoids inability of nickel etching caused by oxides formed on a surface of nickel. However, it would be necessary to increase input power to be provided to a discharge electrode in order to decompose $CO_2$ gas by plasma to thereby sufficiently produce CO acting as an etchant for nickel. Hence, the plasma of $CO_2$ and $H_2$ gases is not allowed to be applied to etching where it is expected to avoid causing a damage to an underlying substrate. For instance, an input power of about 150 W is necessary to be provided to a discharge electrode in order to obtain an etching rate of 1000 angstroms/minute. However, an input power of about 150 W would cause too much ion bombardment to an underlying substrate, resulting in that crystallinity in the underlying substrate would be destroyed. If an input power were reduced down to about 30 W in order to reduce damage to the underlying substrate caused by ion bombardment, an nickel etching rate would be reduced smaller than 500 angstroms/minute, which is not a practical etching rate.

The fourth problem is that exhaust gas resulted from nickel etching was not always disposed properly for making harmless. The reason is as follows. As described in Iwanami, Scientific and Chemical Encyclopedia, the third edition, pp. 981, $Ni(CO_4)$ gas resulted from nickel etching is virulently toxic. However, $Ni(CO_4)$ gas is removed after it has passed through an exhaust pump, $Ni(CO_4)$ gas discharged from an etching chamber pollutes the exhaust pump. Thus, operators doing maintenance of the pump are exposed to serious danger. Such a danger is significantly serious in particular in an oil rotation type rotary pump which requires oil exchanges.

SUMMARY OF THE INVENTION

In view of the foregoing problems of the conventional methods and apparatuses for dry etching nickel, it is an object of the present invention to provide a method of dry etching nickel at a higher etching rate with less damage to an underlying substrate. It is also an object of the present invention to provide an apparatus for making $Ni(CO_4)$ gas non-toxic.

In one aspect of the present invention, there is provided a method of dry etching a nickel film formed on a substrate by means of plasma of an etching gas, where the etching gas includes at least one of CO and $CO_2$ gases, and the substrate is designed to keep a temperature in the range of −25° C. to 40° C. both inclusive, while the substrate is being etched.

It is preferable that the substrate is designed to keep a temperature in the range of 0° C. to 40° C. both inclusive,
while the substrate is being etched. For instance, a temperature of the substrate may be controlled by controlling a temperature of a substrate holder on which the substrate is placed. When a substrate holder is used for placing a substrate thereon, it is preferable that the substrate holder is kept at 0° C. It is also preferable that thermal contact is set between the substrate and a substrate holder on which the substrate is placed so that a temperature of the substrate does not exceed 40° C. while the substrate is being etched.

It is preferable that if a temperature of the substrate is going to exceed 40° C., discharge for producing the plasma is ceased before the temperature exceeds 40° C. In addition, it is preferable that if the temperature of the substrate lowers down to about 0° C., discharge for producing the plasma is re-started.

It is preferable that plasma density and radiation energy of ion radiated onto the substrate are independently controlled. It is preferable that RF power is applied to the substrate for bias control, and electron cyclotron resonant ion source is employed as an ion source, in which case RF power is controlled to be preferably equal to or smaller than 60 W.

There is further provided a of dry etching a nickel film formed on a substrate by means of plasma of an etching gas, where the etching gas includes CO and $CO_2$ gases, and the substrate is designed to keep a temperature in the range of −25° C. to 40° C. both inclusive, while the substrate is being etched.

It is preferable that a volume ratio of the CO gas to the CO and $CO_2$ gases is set equal to or smaller than 65%. When CO and $CO_2$ gases are used for producing plasma, it is preferable that the substrate is etched with a mask made of inorganic material.

There is still further provided a method of dry etching a nickel film formed on a substrate by means of plasma of an etching gas, where the etching gas includes CO, $CO_2$ and $H_2$ gases, and the substrate is designed to keep a temperature in the range of −25° C. to 40° C. both inclusive, while the substrate is being etched.

It is preferable that a volume ratio of the $H_2$ gas to the CO, $CO_2$ and $H_2$ gases is set equal to or greater than 30%.

There is yet further provided a method of dry etching a nickel film formed on a substrate by means of plasma of an etching gas, where the etching gas includes CO and $H_2$ gases, and the substrate is designed to keep a temperature in the range of −25° C. to 40° C. both inclusive, while the substrate is being etched.

In another aspect of the present invention, there is provided an apparatus for making exhaust gas non-toxic, including (a) an exhaust pump for discharging exhaust gas out of an etching apparatus, and (b) a device disposed upstream of the etching apparatus, but downstream of the etching apparatus for removing nickel carbonyl out of the exhaust gas, and introducing a gas including no nickel carbonyl to the exhaust pump.

The apparatus may further include a secondary exhaust pump disposed downstream of the etching apparatus, but upstream of the device, in which case the secondary exhaust pump may be a dry pump employing no oil.

For instance, the exhaust pump may be a pump employing oil.

There is further provided an apparatus for making exhaust gas non-toxic, including (a) an exhaust pump for discharging exhaust gas out of an etching apparatus, and (b) a device disposed upstream of the etching apparatus, but downstream of the etching apparatus for removing nickel carbonyl out of the exhaust gas, for thermally decomposing nickel carbonyl into nickel and carbonyl, and capturing only nickel.

It is preferable that the device includes a heater for heating the exhaust gas, in which case, the heater keeps the exhaust gas at a temperature preferably in the range of 150° C. to 250° C. both inclusive, more preferably of about 200° C.

The heater may be disposed outside a chamber in which the exhaust gas flows, in which case the heater heats the exhaust gas through a wall of the chamber.

It is preferable that the device includes a magnetic field generator for magnetically capturing nickel. For instance, the magnetic field generator may include at least one magnetic fin disposed inside a chamber in which the exhaust gas flows. The magnetic field generator may be disposed outside a chamber in which the exhaust gas flows, the magnetic filed generator magnetically attracting nickel onto an inner wall of the chamber.

As mentioned earlier, in accordance with the method of dry etching Ni, a substrate is kept at −25° C. to 40° C. while nickel is being etched by means of plasma of at least one of CO and $CO_2$. By keeping a substrate at −25° C. or greater, it is possible to have a product, $Ni(CO)_4$, desorbed from a surface of the substrate, which ensures smooth etching of nickel. By keeping a substrate at 40° C. or lower, it is possible to avoid direct reaction between Ni and CO, which ensures no undercut caused by isotropic nickel etching.

In addition, by keeping a substrate at 0° C. to 40° C. while nickel is being etched, a nickel etching rate is rate-determining of ion supply, which ensures no fluctuation in an etching rate regardless of fluctuation in a substrate temperature.

By keeping a substrate holder at about 0° C., a substrate temperature could be readily kept at 0° C. to 40° C. while nickel is being etched.

In the method in accordance with the present invention, there may be used a mixture gas including CO and $CO_2$, a mixture gas including CO, $CO_2$ and $H_2$, or a mixture gas including CO and $H_2$, as an etching gas.

The use of a mixture gas including CO and $CO_2$ ensures a higher etching rate, and further ensures reduction in CO deposition onto a substrate.

The use of a mixture gas including CO, $CO_2$ and $H_2$ ensures a higher etching rate, and further ensures reduction in CO deposition onto a substrate, and still further ensures prevention of oxidation at a surface of nickel and prevention of etching of photoresist, because O and $O_2$ generated by decomposition of CO and $CO_2$ is mixed with $H_2$ gas.

The use of a mixture gas including CO and $H_2$ ensures a higher etching rate, and further ensures prevention of oxidation at a surface of nickel and prevention of etching of photoresist. In addition, it is unnecessary to decompose $CO_2$ into CO and O unlike a mixture gas including $CO_2$, and hence it is possible to carry out a nickel etching at a lower discharge power.

In the method in accordance with the present invention, $Ni(CO)_4$ resulted from nickel dry etching is removed upstream of an exhaust pump system, or upstream of a secondary pump which employs oil. Thus, as an exhaust gas including no nickel carbonyl is introduced into an exhaust pump or a secondary pump, an exhaust pump and a secondary pump are not polluted with nickel carbonyl.

Removal of nickel carbonyl is accomplished by thermally decomposing nickel carbonyl into Ni and CO. Since thermal decomposition produces no absorbent including toxic material, it is not necessary to carry out secondary disposal of toxic material.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[Embodiment 1]

Figure 1:
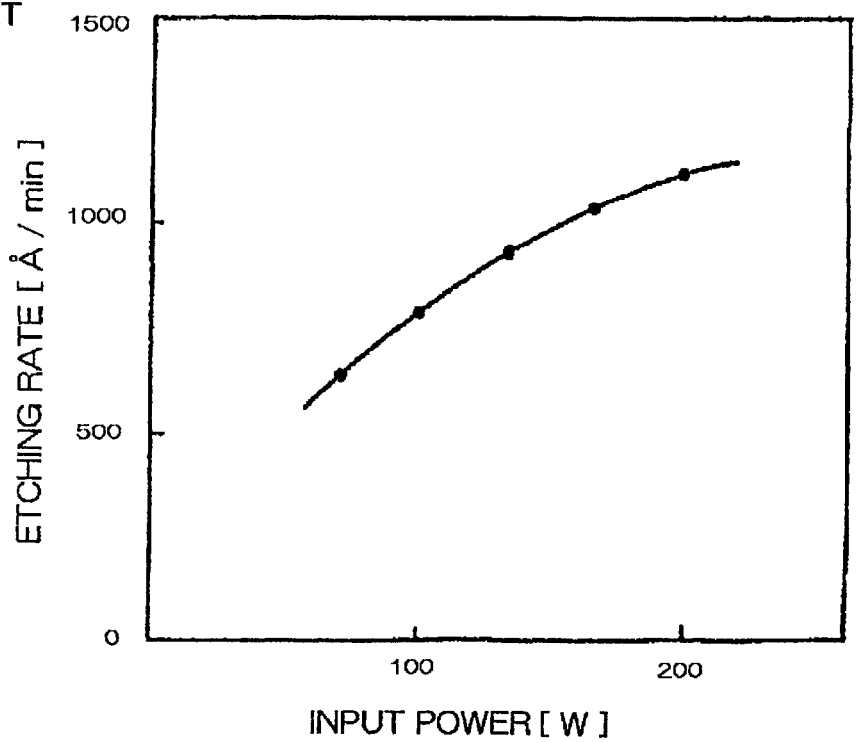
FIG. 1 is a graph showing a relation between an etching rate and input power in a conventional etching apparatus.
Figure 2:
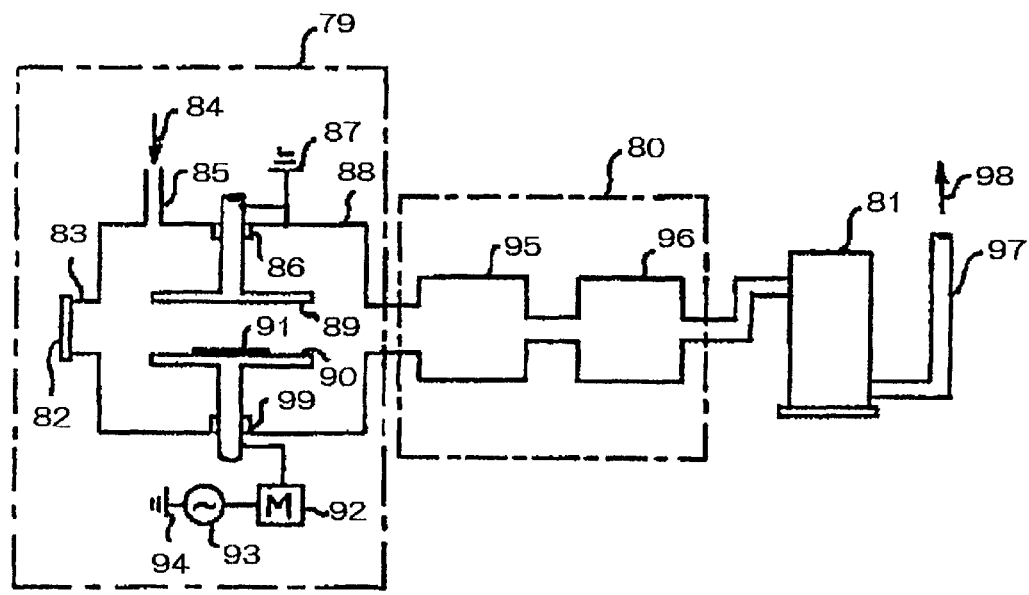
FIG. 2 is a schematic view of a conventional apparatus for making dry etching exhaust gas non-toxic.
Figure 3:
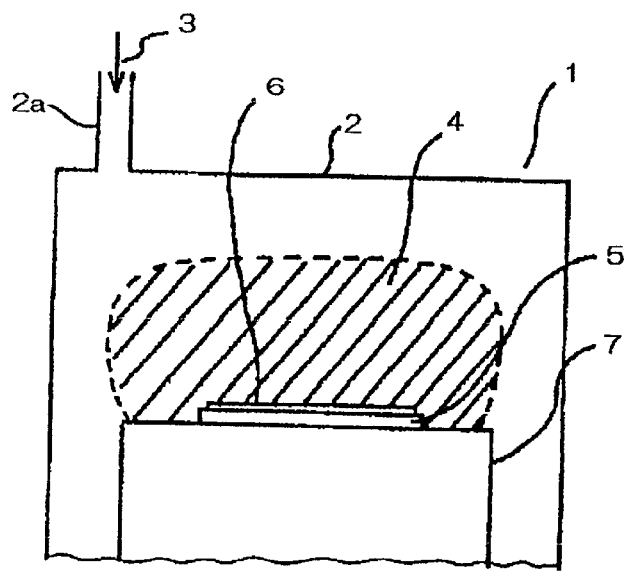
FIG. 3 is a cross-sectional view illustrating a plasma etching apparatus in accordance with the first embodiment of the present invention.

FIG. 3 illustrates a plasma etching apparatus in accordance with the first embodiment. The plasma etching apparatus 1 includes an etching chamber 2, a gas inlet 2a through which an etching gas 3 is introduced into the etching chamber 2, and a substrate holder 7 on which a substrate 5 is placed. A thin nickel film 6 is formed on the substrate 5. The nickel film 6 is etched by plasma of the etching gas 3. While the nickel film 6 is being etched, the substrate holder 7 keeps the substrate 5 at −25° C. to 40° C.

Any dry etching apparatus may be employed as the plasma etching apparatus 1, if it is of a dry etching apparatus having a structure in which ion generated in plasma makes direct contact with a substrate, and it is designed to have means for cooling a substrate. For instance, there may be used a plane parallel plate type RIE etching apparatus, ECR etching apparatus, and ICP etching apparatus. If it is necessary to avoid that a substrate is damaged by ion bombardment, it is preferable to be able to independently control plasma density and ion radiation energy. For instance, there may be used an etching apparatus having a function of applying RF power to a substrate holder for bias control, and including an ion source such as ECR ion source and ICP ion source.

As the etching gas 3, there is used a gas including at least one of CO and $CO_2$ in order to produce CO, an etchant for nickel, in the plasma 4. The use of a mixture gas including CO and $CO_2$, a mixture gas including CO and $H_2$, or a mixture gas including CO, $CO_2$ and $H_2$ ensures a higher etching rate for the thin nickel film 6, and reduction in damage to the substrate 5.

It is preferable that the substrate 5 is kept at 40° C. or lower, because it would be possible to control an etching rate and anisotropically etch nickel with high accuracy. The reason is as follows.

Figure 4:
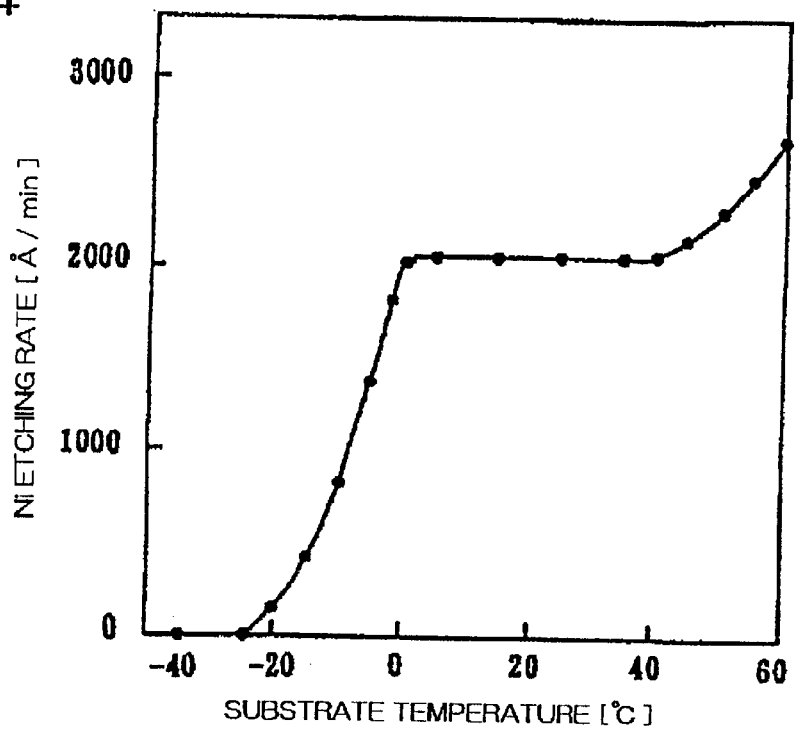
FIG. 4 is a graph showing a relation between an etching rate and a substrate temperature in an etching apparatus in accordance with the first embodiment of the present invention.

FIG. 4 shows a relation between a nickel etching rate and a substrate temperature in an etching apparatus. The relation shown in FIG. 4 was obtained by conducting the experiments where a plane parallel plate type RIE etching apparatus was employed, and etching was made in the following conditions:

Etching gas; a mixture gas of CO gas and $H_2$ gas

CO gas flow rate; 20 sccm $H_2$ gas flow rate; 2 sccm

Gas pressure; 1 Pa

RF power; 50 W (13.56 MHz).

As is obvious in FIG. 4, nickel is not etched at all, if a substrate temperature is equal to or lower than −25° C. A nickel etching rate is increasing as a substrate temperature increases, if a substrate temperature is equal to or lower than 0° C. A nickel etching rate is not dependent on a substrate temperature, and is kept constant, if a substrate temperature is in the range of 0° C. to 40° C. A nickel etching rate is increasing as a substrate temperature increases, if a substrate temperature is equal to or higher than 40° C.

The reason is considered as follows. Since a product resulted from nickel etching, $Ni(CO)_4$, has a fusing point of −25° C., $Ni(CO)_4$, is not evaporated, if a substrate temperature is equal to or lower than −25° C. A nickel etching rate is dependent on an evaporation rate of $Ni(CO)_4$, namely a vapor pressure of $Ni(CO)_4$, if a substrate temperature is in the range of −25° C. and 0° C. A nickel etching rate is dependent on ion radiation exciting a surface of nickel, if a substrate temperature is in the range of 0° C. and 40° C. A nickel etching rate is dependent on an dependency of direct reaction between Ni and CO gas molecules on a temperature, if a substrate temperature is equal to or higher than 40° C.

Accordingly, a substrate temperature is preferably in the range of 0° C. and 40° C. for carrying out nickel etching with a stable etching rate. However, it should be noted that a lower limit temperature at which the rate-determining factor in a nickel etching rate was switched from the evaporation rate of $Ni(CO)_4$ to the ion radiation, namely a lower limit temperature among temperatures at which a nickel etching rate is not dependent on a substrate temperature was 0° C., but that this lower limit temperature may be higher or lower than 0° C. in dependence on etching conditions such as an etching apparatus, gas flow rate and RF power.

Figure 5A:
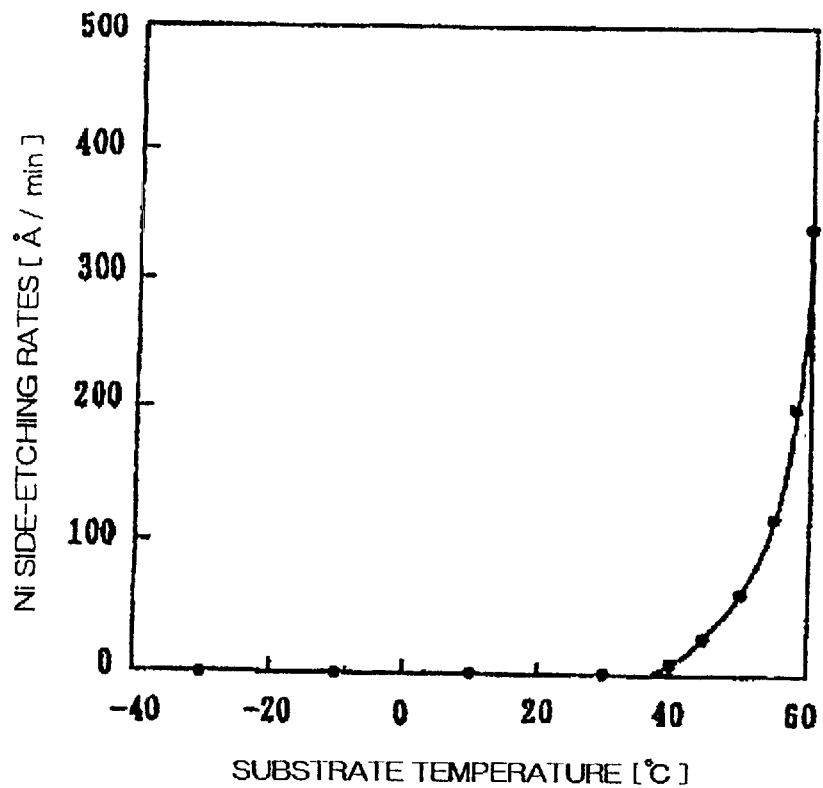
FIG. 5A is a graph showing a relation between a side etching rate and a substrate temperature in an etching apparatus in accordance with the first embodiment of the present invention.
Figure 5B:
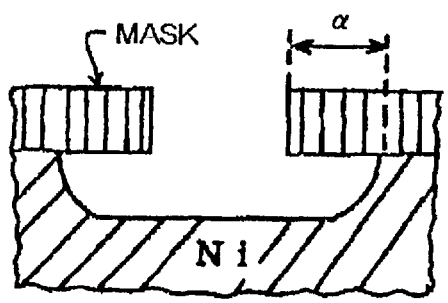
FIG. 5B is a partial cross-sectional view of etched nickel, showing the definition of the side-etching rate.

FIG. 5A illustrates a relation between a side etching rate of nickel and a substrate temperature in the etching apparatus in accordance with the first embodiment, and FIG. 5B shows the definition of the side etching rate of nickel. The relation shown in FIG. 5A was obtained by the experiments conducted in the same conditions as those of FIG. 4.

As is obvious in FIG. 5A, nickel is scarcely side-etched, if a substrate temperature is equal to or lower than 40° C., whereas a side etching rate begins to increase at about 40° C. This phenomenon is considered that direct reaction between CO and Ni begins at about 40° C. Accordingly, it is preferable that a substrate temperature is kept at about 40° C. or lower in order to carry out anisotropic etching of nickel with high accuracy.

Again, the nickel film 6 can be anisotropically etched with high accuracy when a temperature of the substrate 5 is in the range of −25° C. and 40° C. both inclusive. A nickel etching can be carried out with high controllability without fluctuation in an etching rate caused by fluctuation in a substrate temperature, when a temperature of the substrate 5 is in the range of 0° C. and 40° C. both inclusive. Thus, it is concluded that the substrate holder 7 is preferably kept at a lower limit temperature among temperatures at which a nickel etching rate is not dependent on a substrate temperature, for instance, at 0° C., and that the substrate holder 7 is preferably designed to make thermal contact with the substrate 5 so that a temperature of the substrate 5 does not exceed 40° C. due to heat resulted from plasma, while the nickel film 6 is being etched.

Thus, if the plasma etching apparatus does not include means for automatically controlling a temperature of the substrate holder 7 in dependence on the substrate 5 being heated by the plasma 4 so that the substrate 5 is kept in the range of 0° C. and 40° C. while the nickel film 6 is being etched, an etching rate can be kept constant from an etching is begun until an etching is finished.

If it would be difficult to keep the substrate 5 at 40° C. or lower because of insufficient thermal contact between the substrate 5 and the substrate holder 7, discharge for producing the plasma 4 may be stopped before a temperature of the substrate 5 exceeds 40° C., and discharge may be re-started after a temperature of the substrate 5 is lowered to a lower limit temperature among temperatures at which a nickel etching rate is not dependent on a substrate temperature, for instance, 0° C.

[Embodiment 2]

An etching carried out in the second embodiment is almost the same as the nickel dry etching carried out in the first embodiment except that there is used a mixture gas including CO and $CO_2$, a mixture gas including CO, $CO_2$ and $H_2$, or a mixture gas including CO and $H_2$, as an etching gas.

Figure 6:
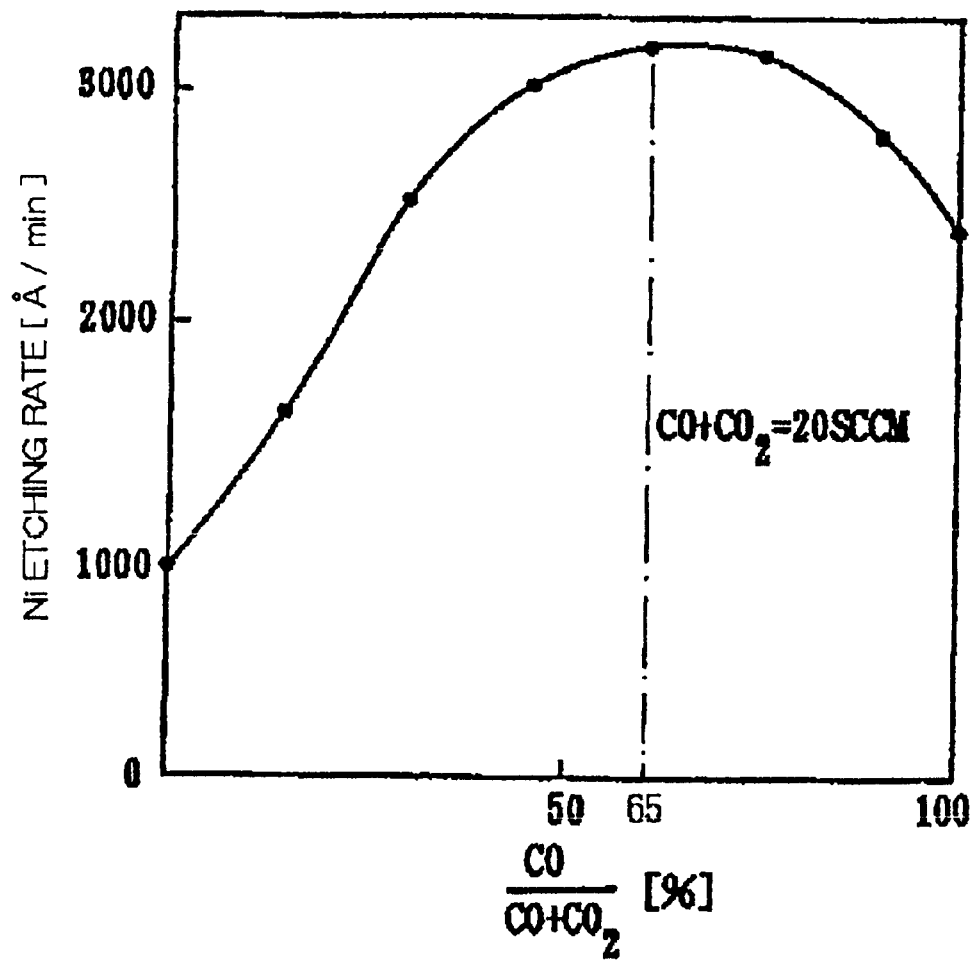
FIG. 6 is a graph showing a relation between an etching rate and an etching gas volume percent in an etching apparatus in accordance with the second embodiment of the present invention

The use of a mixture gas including CO and $CO_2$ provides a higher etching rate than an etching rate obtained when only $CO_2$ gas is used. FIG. 6 illustrates a relation between a nickel etching rate and a mixture ratio of CO to CO and $CO_2$. The relation shown in FIG. 6 was obtained by the experiments conducted in the following conditions:

Apparatus; Plano parallel plate type reactive ion etching apparatus

Etching gas; A mixture gas of CO and $CO_2$

Gas flow rate of etching gas; 20 sccm

Gas pressure; 1 Pa

RF power; 100 W (13.56 MHz)

Substrate holder temperature; 0° C.

Herein, the substrate holder doubled as a cathode. The reason why the substrate holder was kept at 0° C. is to utilize CO for nickel etching and simultaneously prevent side etching of the nickel film, similarly to the first embodiment.

As is obvious in FIG. 6, a nickel etching rate abruptly increases, as CO gas is added to $CO_2$ gas. This is considered because an etchant for nickel is increased, since CO gas itself is an etchant for nickel.

The etching rate shown in FIG. 6 has a maximum peak at about 65% of CO concentration, and decreases if CO concentration is over 65%. The reason why the etching rate decreases if CO concentration is over 65% is that if CO gas concentration becomes high, non-volatile carbon generated by decomposition of CO would deposit on a substrate and obstruct nickel etching. Accordingly, a mixture ratio of CO gas to CO and $CO_2$ gases has an optimal value, which is dependent on an etching apparatus, gas flow rate, substrate temperature and/or RF power. Anyway, the use of a mixture gas including CO and $CO_2$ provides a higher etching rate. Though a surface of nickel is oxidized by O and $O_2$ generated by decomposition of CO and $CO_2$, it does not cause a problem, because an oxide film is readily sputtered if ion energy is set slightly higher.

Thus, it is concluded that a mixture gas of CO and $CO_2$ is suitable for nickel etching at a high etching rate and at a relatively high voltage. Since O and $O_2$ generated by decomposition of CO and $CO_2$ have a function of etching photoresist, it is preferable to use a mask made of inorganic material, if it were desired to enhance etching accuracy.

The use of a mixture gas including CO, $CO_2$ and $H_2$ provides an etching rate slightly smaller than an etching rate obtained when a mixture gas including CO and $CO_2$ is used as an etching gas, but makes it possible to carry out etching with high accuracy with less etching in photoresist as a mask.

Figure 7:
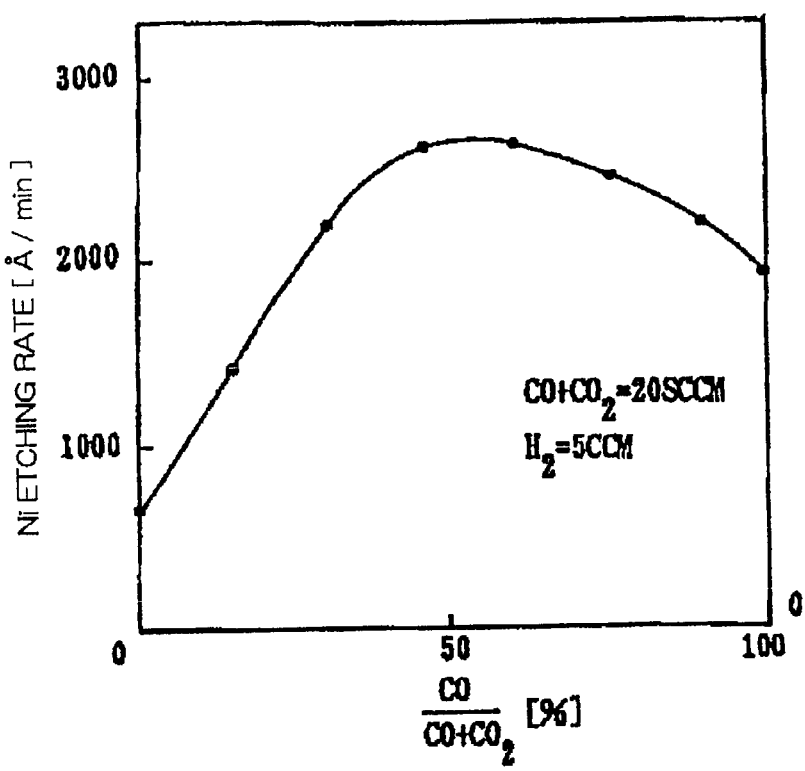
FIG. 7 is a graph showing a relation between an etching rate and an etching gas volume percent in an etching apparatus in accordance with the second embodiment of the present invention.

FIG. 7 shows a relation between a nickel etching rate and a mixture ratio of CO to CO and $CO_2$ in the second embodiment. The relation shown in FIG. 7 was obtained by the experiments conducted in the following conditions:

Apparatus; Plane parallel plate type reactive ion etching apparatus

Etching gas; A mixture gas of CO and $CO_2$

Gas flow rate of etching gas; 20 sccm

Gas flow rate of $H_2$ gas; 5 sccm

Gas pressure; 1 Pa

RF power; 100 W

Frequency of RF power; 13.56 MHz

Substrate holder temperature; 0° C.

Comparing to the relation shown FIG. 6 where a mixture gas including CO and $CO_2$ is used, the relation shown in FIG. 7 has the same tendency. However, a nickel etching rate has a maximum peak when CO concentration is about 50% smaller than that of the relation shown in FIG. 6.

This is because CO is readily deposited onto a substrate due to addition of $H_2$ gas. An etching rate at the maximum peak thereof is about 3200 angstroms per minute in FIG. 6 where a mixture gas including CO and $CO_2$ is used, whereas an etching rate at the maximum peak thereof is about 2600 angstroms per minute in FIG. 7, which is smaller than that of FIG. 6. However, the etching rate of about 2600 angstroms per minute in FIG. 7 is about three times greater than an etching rate of about 900 angstroms per minute obtained when only $CO_2$ is used as an etching gas.

Figure 8:
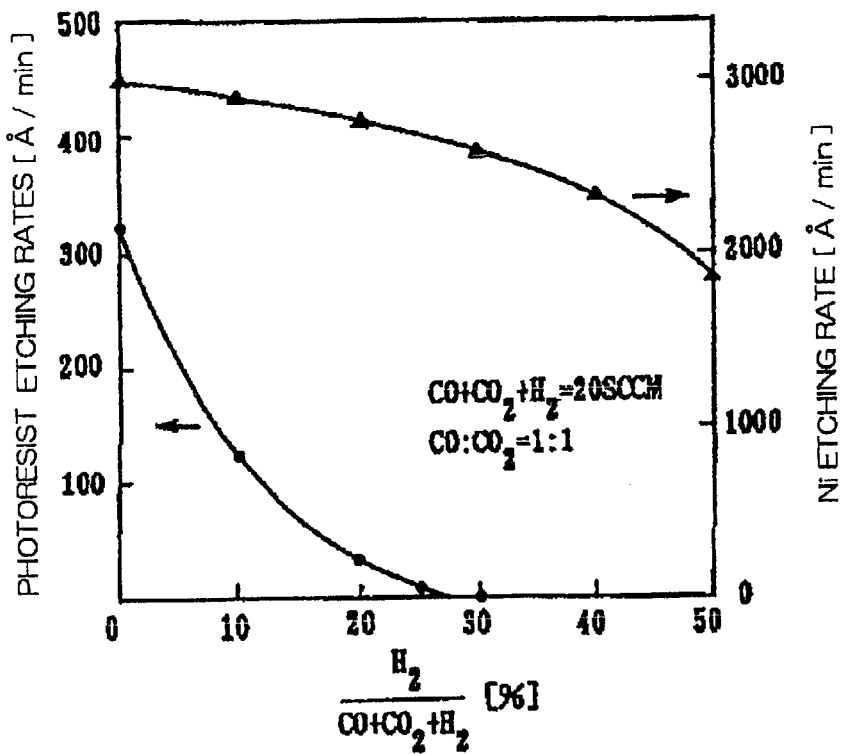
FIG. 8 is a graph showing a relation between etching rates and an etching gas volume percent in an etching apparatus in accordance with the second embodiment of the present invention.

FIG. 8 illustrates a relation between a side etching rate of photoresist and a mixture ratio of $H_2$ gas to CO, $CO_2$ and $H_2$ gases, and also between a nickel etching rate and the same mixture ratio. The relation shown in FIG. 8 was obtained by the experiments conducted in the following conditions:

Apparatus; Plane parallel plate type reactive ion etching apparatus

Etching gas; A mixture gas of CO, $CO_2$ and $H_2$ gases

Gas flow rate of etching gas; 20 sccm

Mixture ratio between CO and $CO_2$; 1:1

Gas pressure; 1 Pa

RF power; 100 W

Frequency of RF power; 13.56 MHz

Substrate holder temperature; 0° C.

It is found in FIG. 8 that the side etching rate of photoresist abruptly decreases as the mixture ratio of $H_2$ gas to CO, $CO_2$ and $H_2$ gases increases, and reaches zero (0) at about 30% of the mixture rate. The side etching rate of photoresist being zero (0) means that photoresist is not side etched at all. As the mixture ratio of $H_2$ gas to CO, $CO_2$ and $H_2$ gases increases, the nickel etching rate gradually decreases. However, the etching rate at 30% of the mixture ratio is about 2700 angstroms per minute which is equal to about 86% of the etching rate at 0% of the mixture ratio, and is about three times greater than the etching rate of about 900 angstroms per minute obtained when only $CO_2$ is used as an etching gas.

Thus, the use of a mixture gas including CO, $CO_2$ and $H_2$ gases provides great etching selectivity of nickel to photoresist, and hence is suitable for nickel etching at a high rate with high accuracy with photoresist being used as a mask.

The use of a mixture gas including CO and $H_2$ gases makes it possible to carry out etching with high accuracy and further with less damage to a substrate.

Figure 9:
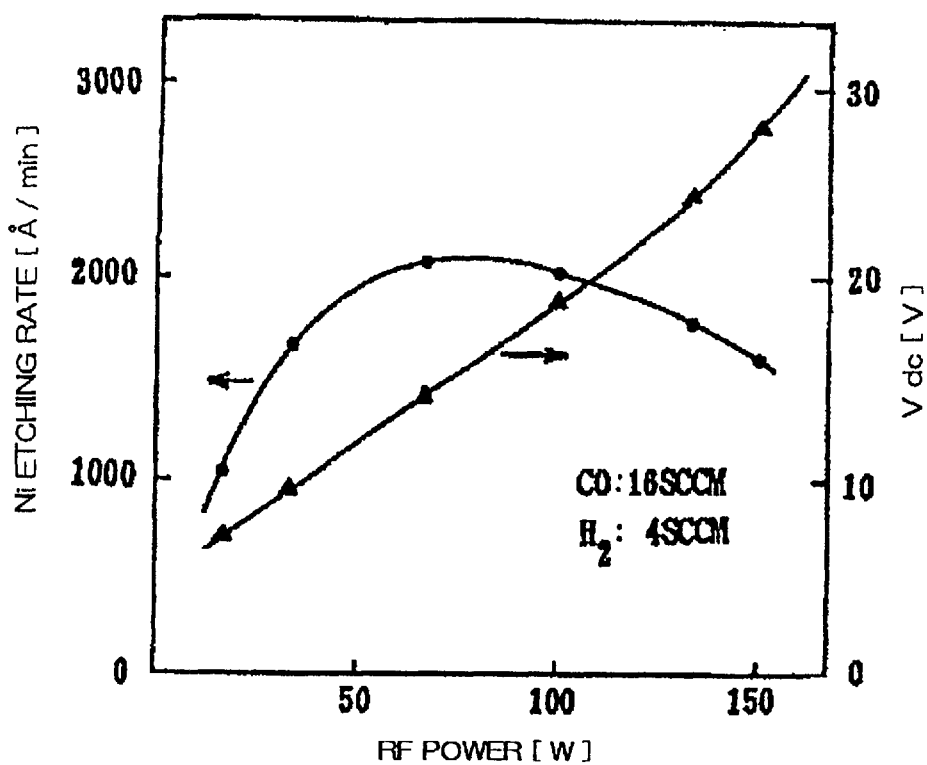
FIG. 9 is a graph showing a relation between an etching rate and RF power in an etching apparatus in accordance with the second embodiment of the present invention.

FIG. 9 illustrates a relation between a nickel etching rate and RF power, and also between a bias voltage Vdc applied to a cathode and RF power. The relation shown in FIG. 9 was obtained by the experiments conducted in the following conditions:

Apparatus; Plane parallel plate type reactive ion etching apparatus

Etching gas; A mixture gas of CO and $H_2$ gases

CO gas flow rate; 16 sccm $H_2$ gas flow rate; 4 sccm

Gas pressure; 1 Pa

Frequency of RF power; 13.56 MHz

Substrate holder temperature; 0° C.

It is found in FIG. 9 that a nickel etching rate increases as RF power increases, and reaches a maximum peak when RF power is about 60 W, and thereafter decreases as RF power increases. The reason why the etching rate decrease at 60 W of RF power or greater is that a growing amount of carbon generated by decomposition of CO deposits onto a substrate to thereby prevent nickel etching from being carried out.

However, it should be noted that the maximum etching rate is over 2000 angstroms per minute regardless of low RF power, specifically, 60 W. The bias voltage Vdc may be an indication of ion energy. The bias voltage Vdc is about 14V at 60 W of RF power, which is sufficiently low not to destroy crystallinity of an underlying substrate made of GaAs. The photoresist mask formed on a thin nickel film was not side etched at all, because $H_2$ gas was added to the etching gas. As a conclusion, the use of a mixture gas including CO and $H_2$ gases is suitable for nickel etching, where photoresist is used as a mask, with high accuracy and less damage to a substrate.

[Embodiment 3]

Figure 10:
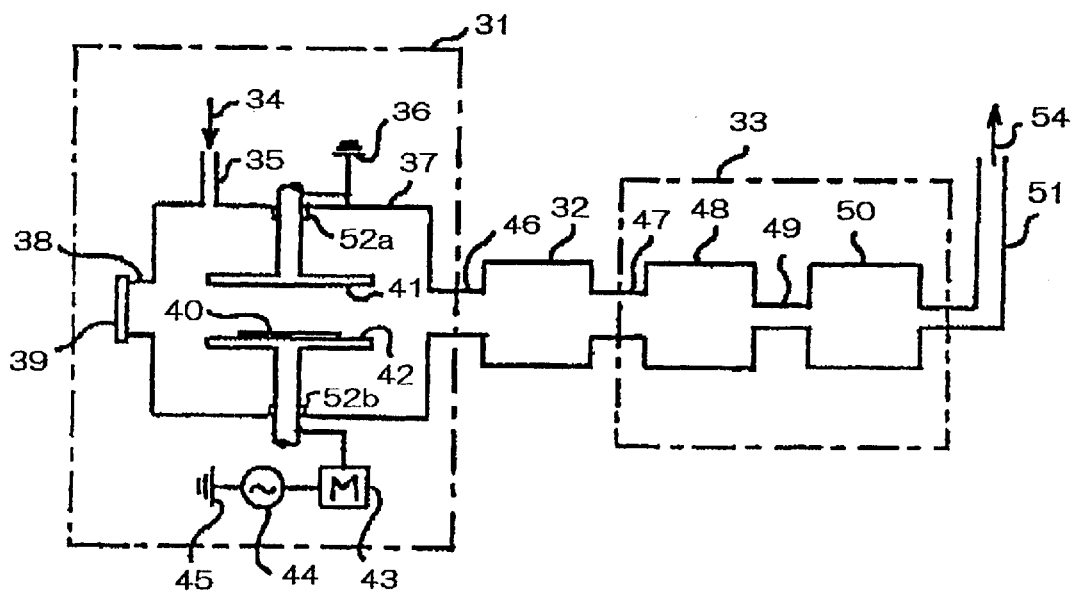
FIG. 10 is a schematic view illustrating an apparatus for making dry etching exhaust gas non-toxic in accordance with the third embodiment of the present invention.

FIG. 10 illustrates an apparatus for making dry etching exhaust gas non-toxic in accordance with the third embodiment. The apparatus for making dry etching exhaust gas non-toxic in accordance with the instant embodiment removes nickel carbonyl represented with $Ni(CO)_4$ out of dry etching exhaust gas. The $Ni(CO)_4$ removal apparatus 32 is disposed downstream of a dry etching apparatus 31, and upstream of an exhaust pump system 33. An exhaust gas 54 from which $Ni(CO)_4$ is removed by the apparatus 32 is released to atmosphere, or introduced to another apparatus for removing toxic material other than $Ni(CO)_4$, through an exhaust conduit 51. When a throttle valve for controlling exhaust conductance is to be used, the throttle valve is disposed just downstream of the dry etching apparatus.

The etching apparatus 31 includes an etching chamber 37 having a gas inlet 35 through which etching gas 34 is introduced into the etching chamber 37. The etching chamber 37 is provided with a gate 38 which is designed to be open or closed by means of a gate valve 39. Inside the etching chamber 37 are disposed an anode 41 and a cathode 42. The anode 41 is supported in the etching chamber 37 with an insulator 52a, and is grounded at 36. The cathode 42 is supported in the etching chamber 37 with an insulator 52b in the same fashion as the anode 41, and is electrically connected to RF power source 44 via a matching box 43. The RF power source 44 is grounded at 45. A substrate 40 on which a thin nickel film to be etched is formed is placed on the cathode 42.

The etching apparatus 31 is connected to the $Ni(CO)_4$ removal apparatus 32 through a conduit 46. The exhaust pump system 33 includes a booster pump or turbo-molecular pump 48, and a rotary pump employing oil for rotation or a dry pump 50 employing no oil for rotation, disposed downstream of the pump 48. The $Ni(CO)_4$ removal apparatus 32 is connected to the booster pump 48 through a conduit 47, and the booster pump 48 is connected to the dry pump 50 through a conduit 49. The exhaust conduit 51 is connected to the dry pump 50.

In accordance with the third embodiment illustrated in FIG. 10, an exhaust gas from which $Ni(CO)_4$ is removed by the $Ni(CO)_4$ removal apparatus 32 is introduced into the exhaust pump system 33, the exhaust pump system 33 is not polluted with deadly poisonous nickel carbonyl, $Ni(CO)_4$.

Figure 11:
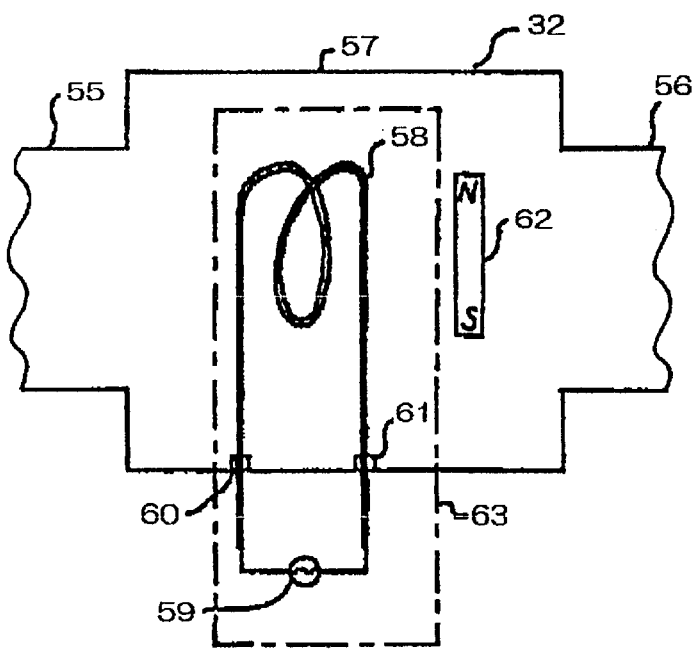
FIG. 11 is an enlarged view illustrating a part of the apparatus illustrated in FIG. 10.

FIG. 11 illustrates a structure of the $Ni(CO)_4$ removal apparatus 32. The $Ni(CO)_4$ removal apparatus 32 includes a heater 63 for heating an exhaust gas, and a magnetic field generator 62. The heater 63 is comprised of a heating wire 58 located in the chamber 57, a power source 59 for providing power to the heating wire 58, and insulators 60 and 61 for providing electrical isolation between the heating wire 58 and the chamber 57. The magnetic field generator 62 is a permanent magnet having N and S poles. The operation of the $Ni(CO)_4$ removal apparatus 32 is based on that the reaction, $Ni(CO)_4 \rightarrow Ni+4CO$, occurs at 200° C.

The exhaust gas containing $Ni(CO)_4$ therein, discharged out of the dry etching apparatus 31 is introduced into a chamber 57 through a gas inlet 55. In the chamber 57, the exhaust gas is heated with the heater 63 up to about 200° C., resulting in that nickel carbonyl $Ni(CO)_4$, is decomposed into Ni and CO. When nickel carbonyl $Ni(CO)_4$ is decomposed into Ni and CO, Ni is generated in the form of soot. Hence, if the nickel soot is introduced into the exhaust pump system 33 disposed downstream of the $Ni(CO)_4$ removal apparatus 32, the exhaust pump system 33 may be destroyed.

Hence, in order to prevent destruction of the exhaust pump system 33, the $Ni(CO)_4$ removal apparatus 32 is designed to absorb nickel soot or powder generated by decomposition of $Ni(CO)_4$ to the magnetic field generator or permanent magnet 62. On the other hand, CO gas is introduced into the exhaust pump system 33 without being disposed of through an exhaust conduit 56.

It is preferable that the heater 63 heats the exhaust gas at 150° C. to 250° C. both inclusive. A temperature at which nickel carbonyl $Ni(CO)_4$ is decomposed into Ni and CO with a highest efficiency is about 200° C. Since the $Ni(CO)_4$ removal apparatus 32 is disposed upstream of the exhaust pump system 33, there is a fear that exhaust conductance is deteriorated. However, deterioration in exhaust conductance is avoidable by designing the chamber 57 to have a great cross-sectional area, and by designing the heater 63 and the magnetic field generator 62 to have a suitable structure and be disposed in a suitable arrangement.

The heater 63 and the magnetic field generator 62 are disposed in the chamber 57 in the $Ni(CO)_4$ removal apparatus 32 illustrated in FIG. 11. However, it should be noted that they may be disposed outside the chamber 57 so that the exhaust gas is heated through a wall of the chamber 57, and so that nickel powder is absorbed onto an inner wall of the chamber 57, in which case, it is necessary to further enhance exhaust conductance of the exhaust gas.

Figure 12:
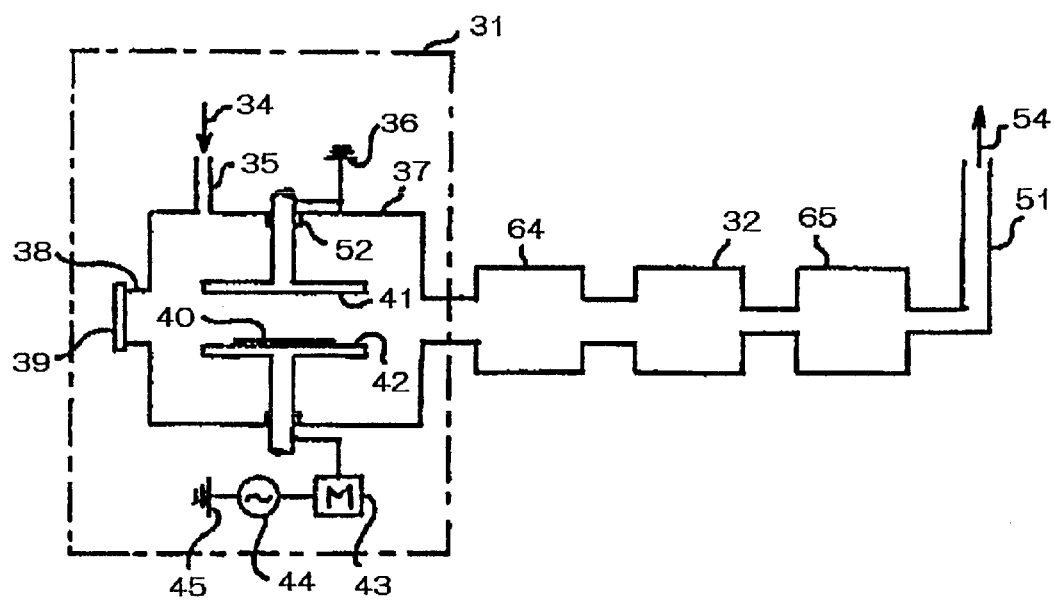
FIG. 12 is a schematic view illustrating an apparatus for making dry etching exhaust gas non-toxic in accordance with a variation of the third embodiment of the present invention.

The exhaust gas is reduced in a speed by passing through the $Ni(CO)_4$ removal apparatus 32. If the exhaust gas speed is further reduced, there may be employed pumps upstream or downstream of the apparatus 32. FIG. 12 illustrates an example of such an arrangement. In the apparatus illustrated in FIG. 12, a dry pump 64 is disposed between the dry etching apparatus 31 and the $Ni(CO)_4$ removal apparatus 32, and a secondary pump 65 is disposed downstream of the apparatus 32. In the apparatus illustrated in FIG. 12, an exhaust gas speed is dependent on a capacity of the dry pump 64, and hence reduction in exhaust conductance caused by the $Ni(CO)_4$ removal apparatus 32 does not exert an influence on the exhaust gas speed.

The dry pump 64 is a pump employing on oil such as a mechanical booster pump and a turbo-molecular pump, and hence does not include a pump employing oil such as an oil diffusion pump and an oil rotation type rotary pump.

Since the secondary pump 65 receives therein the exhaust gas from which $Ni(CO)_4$ is removed, there is no limitation as to the secondary pump 65. Namely, a dry pump or an oil rotation type rotary pump may be employed as the secondary pump 65.

[Embodiment 4]

A method of dry etching nickel in accordance with the fourth embodiment of the present invention is explained hereinbelow with reference to FIG. 13.

Figure 13:
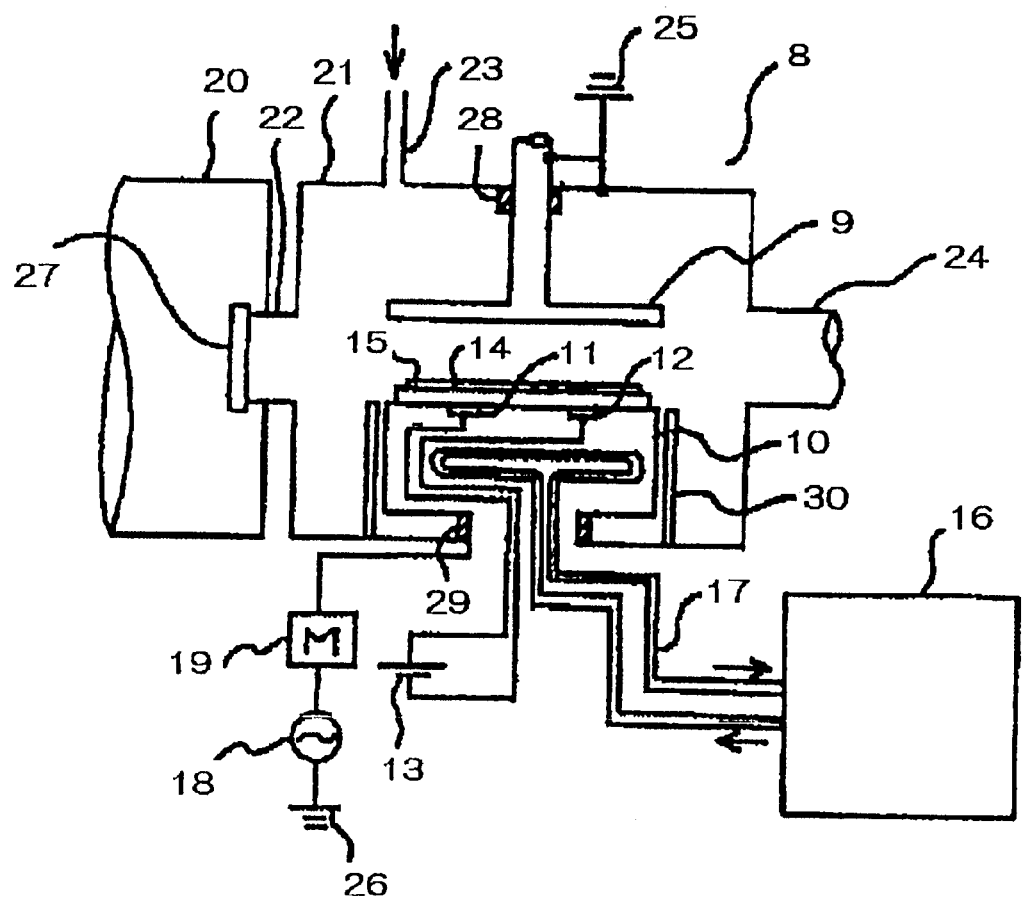
FIG. 13 is a schematic view illustrating a dry etching apparatus in accordance with the fifth embodiment of the present invention.

FIG. 13 illustrates a dry etching apparatus employed in the fourth embodiment. The illustrated dry etching apparatus 8 is of a plane parallel plate type RIE apparatus. The dry etching apparatus 8 has an etching chamber 21. Inside the etching chamber 8 are disposed an anode 9 as an upper electrode and a cathode 10 as a lower electrode. The anode 9 is supported in the etching chamber 8 with an insulator 28, and is grounded at 25. The cathode 10 is supported in the etching chamber 8 with an insulator 29 in the same fashion as the anode 9, and is electrically connected to RF power source 18 via a matching box 19. The RF power source 18 is grounded at 26. The cathode 10 is surrounded with a cover 30. A substrate 14 on which a thin nickel film 15 to be etched is formed is placed on the cathode 10.

The anode 9 and cathode 10 are formed circular, and have a diameter of 30 cm. The anode 9 and cathode 10 are spaced away from each other by 3 cm. The cathode 10 doubles as a substrate holder. A pair of electrodes 11 and 12 are disposed at a surface of the cathode 10. The substrate 14 can be electrostatically chucked onto the cathode 10 by applying a dc voltage up to 500 V to the electrodes 11 and 12 from a dc voltage source 13. The electrostatic chuck causes the substrate 14 closely placed onto the cathode 10, ensuring enhancement in thermal conductance between the substrate 14 and the cathode 10.

Cooling medium cooled in a chiller 16 is provided to the cathode 10 through a conduit 17 to thereby cool a surface of the cathode 10. The RF power source 18 provides RF power having a frequency of 13.56 MHz to matching box 19 for matching RF power in impedance. The thus impedance-matched RF power is provided to the cathode 10.

The etching chamber 8 is connected to a lord lock chamber 20 through a gate 22 which is open or closed by a gate valve 27. The lord rock chamber 20 is kept to be vacuous at 10 Pa. The substrate 14 is transferred from the lord lock chamber 20 to the cathode 10 in the etching chamber 21 through the gate 22 with a robot arm (not illustrated). The dry etching apparatus 8 is formed with a gas inlet 23 through which an etching gas is introduced into the etching chamber 8, and further with an exhaust gas outlet 24 through which an exhaust gas is discharged to an exhaust gas disposal system.

The etching was carried out employing the above-mentioned dry etching apparatus, as follows. The thin nickel film 15 is formed by evaporation by a thickness of 5000 angstroms on the substrate 14 having a diameter of 2 inches and made of semi-insulating GaAs. The thin nickel film 15 was patterned with photoresist by photolithography and dry etching. As an etching gas was used a mixture gas including CO at 20 sccm and $H_2$ at 5 sccm. A gas pressure was kept at 1 Pa by controlling an exhaust gas speed with a throttle valve (not illustrated). The RF power source 18 was designed to provide 50 W to the cathode 10. The chiller 16 was designed to keep the cooling medium at 0° C. The dc power source 13 was designed to apply 300 V to the electrodes 11 and 12 which cooperated with each other to thereby accomplish a function of electrostatic chuck.

As a result, there was obtained a nickel etching rate of 1200 angstroms per minute. After over etching by 50%, there was obtained a vertically etched surface without side etching. While the nickel film 15 is being etched, a temperature of a surface of the substrate 14 was measured by means of a thermo-seal adhered onto the nickel film 15. A temperature of a surface of the substrate 14 was raised from 0° C. to 15° C. Thus, it was confirmed that the substrate 15 could be kept at a temperature in the range of 0° C. to 40° C.

[Embodiment 5]

A method of dry etching nickel in accordance with the fifth embodiment of the present invention is explained hereinbelow. The etching was carried out by employing the dry etching apparatus 8 illustrated in FIG. 13 in the following conditions.

CO gas flow rate: 10 sccm
$CO_2$ gas flow rate: 10 sccm
Gas pressure: 1 Pa
Temperature in the chiller 16: 0° C.
DC voltage for electrostatic chuck: 300 V
RF power: 200 W As a result, there was obtained a nickel etching rate of 4200 angstroms per minute. It took one minute and forty seven seconds to form a $SiO_2$ mask by patterning a 1000 angstroms-$SiO_2$ film on a 5000 angstroms-nickel film evaporated onto a substrate having a 2-inch diameter and made of semi-insulating GaAs, and etch the nickel film with over etching by 50%. The thus formed nickel pattern had a vertically etched side surface, which means that there was no dimensional error between the $SiO_2$ mask and the actually formed nickel film pattern.

[Embodiment 6]

A method of dry etching nickel in accordance with the sixth embodiment of the present invention is explained hereinbelow. The etching was carried out by employing the dry etching apparatus 8 illustrated in FIG. 13 in the following conditions.

CO gas flow rate: 7 sccm
$CO_2$ gas flow rate: 7 sccm
$H_2$ gas flow rate: 6 sccm
Gas pressure: 1 Pa
Temperature in the chiller 16: 0° C.
DC voltage for electrostatic chuck: 300 V
RF power: 150 W As a result, there was obtained a nickel etching rate of 3100 angstroms per minute. It took two minutes and twenty five seconds to form a mask of 1 $\mu$m thick-photoresist on a 5000 angstroms-nickel film evaporated onto a substrate having a 2-inch diameter and made of semi-insulating GaAs, and etch the nickel film with over etching by 50%. The residual photoresist had a thickness of 9100 angstroms after etching had been completed. The photoresist was not side-etched, and an etched side surface over the photoresist and the nickel film was vertical. There was no dimensional error between the photoresist mask and the actually formed nickel film pattern.

[Embodiment 7]

A method of dry etching nickel in accordance with the seventh embodiment of the present invention is explained hereinbelow. The etching was carried out by employing the dry etching apparatus 8 illustrated in FIG. 13 in the following conditions.

CO gas flow rate: 16 sccm
$H_2$ gas flow rate: 4 sccm
Gas pressure: 1 Pa
Temperature in the chiller 16: 0° C.
DC voltage for electrostatic chuck: 300 V
RF power: 60 W As a result, there was obtained a nickel etching rate of 2050 angstroms per minute. It took three minutes and forty seconds to form a mask of 1 $\mu$m thick-photoresist on a 5000 angstroms-nickel film evaporated onto a substrate having a 2-inch diameter and made of semi-insulating GaAs, and etch the nickel film with over etching by 50%. The residual photoresist had a thickness of 9300 angstroms after etching had been completed. The photoresist was not side-etched, and an etched side surface over the photoresist and the nickel film was vertical. There was no dimensional error between the photoresist mask and the actually formed nickel film pattern. The bias voltage Vdc applied to the cathode was kept at 14V.

[Embodiment 8]

An apparatus for removing toxic material out of an exhaust gas resulted from nickel dry etching, in accordance with the eighth embodiment of the present invention is explained hereinbelow. A toxic removal apparatus 78 illustrated in FIG. 14 is connected downstream of a plane parallel plate type RIE apparatus in which a nickel film formed on a substrate is etched in the following conditions.

CO gas flow rate: 7 sccm
$CO_2$ gas flow rate: 7 sccm
$CO_2$ gas flow rate: 6 sccm
Gas pressure: 1 Pa
RF power: 150 W A turbo-molecular pump (not illustrated) is disposed downstream of the toxic removal apparatus 78, and an oil rotation type rotary pump (not illustrated) is disposed downstream of the turbo-molecular pump. The rotary pump is formed with an exhaust gas conduit connected to a gas scrubber (not illustrated).

Figure 14:
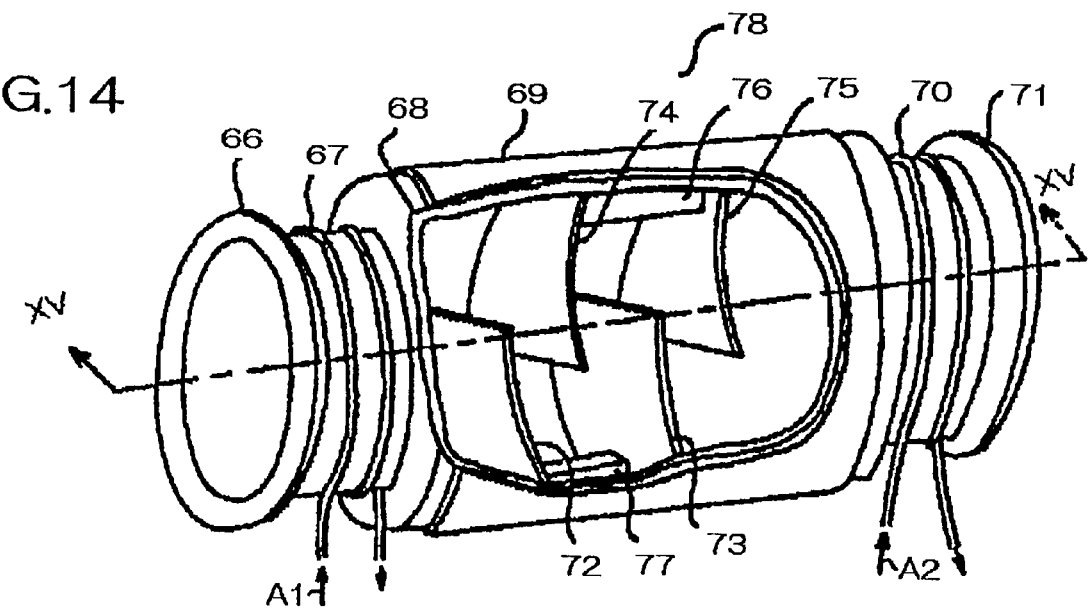
FIG. 14 is a schematic view illustrating an apparatus for making dry etching exhaust gas non-toxic in accordance with the sixth embodiment of the present invention.
Figure 15:
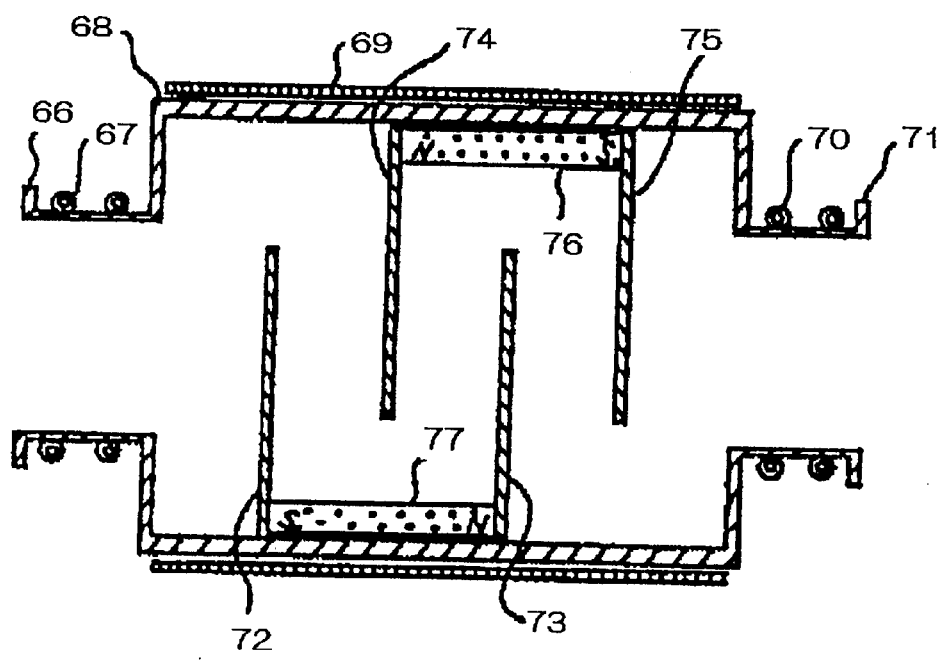
FIG. 15 is a cross-sectional view taken along the line XV—XV in FIG. 14

FIG. 14 illustrates the toxic removal apparatus 78, and FIG. 15 is a cross-sectional view taken along the line XV—XV in FIG. 14. A toxic removal tube 68 is made austenitic stain-less steel, and fins 72, 73, 74 and 75 made of ferritic stain-less steel alternately project inside the toxic removal tube 68. The fins 72 and 73 are adhered to S and N poles of a magnet 77 Similarly, the fins 74 and 75 are adhered to N and S poles of a magnet 76. Since the fins 72, 73, 74 and 75 are made of ferritic stain-less steel, they are ferromagnetic. In addition, the fins 72, 73, 74 and 75 are adhered to the magnets 76 and 77, they are magnetic.

Cooling water conduits 67 and 70 are welded to opposite ends of the toxic removal tube 68. A band heater 69 is wound around the toxic removal tube 68. The band heater 69 electrically heats and keeps the toxic removal tube 68 and the fins 72, 73, 74 and 75 at 180° C. Heating value provided by the band heater 69 is controlled by any suitable means. Cooling water flows through the cooling water conduits 67 and 70 as indicated with arrows A1 and A2 to thereby prevent heat generated by the band heater 69 from transferring to an intake opening 66 and an exhaust opening 71.

The toxic removal apparatus 78 operates as follows. An exhaust gas containing nickel carbonyl, introduced into the toxic removal apparatus 78 through the intake opening 66 makes contact with the toxic removal tubes 68 and the fins 72 to 75 all kept at 180° C. to thereby be heated up to 180° C. Thus, the fins 72 to 75 act as a heating plate.

Nickel carbonyl $Ni(CO)_4$ contained in the thus heated exhaust gas is decomposed into Ni powder and CO gas in accordance with the following equation.

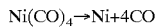

$$Ni(CO)_4 \rightarrow Ni + 4CO$$

Since Ni is ferromagnetic, Ni powder is attracted to the magnetic fins 72 to 75. CO gas is exhausted through the exhaust opening 71.

Thus, it is possible to use the fins 72 to 75 as a plate for capturing nickel powder thereto, by making the fins 72 to 75 of ferromagnetic material and magnetizing them. In addition, by making the fins 72 to 75 of ferritic stain-less steel, it would be possible to form the fins 72 to 75 ferromagnetic and corrosion-resistant. As an alternative, by making the fins 72 to 75 of martensite stain-less steel or nickel, it would be also possible to form the fins 72 to 75 ferromagnetic and corrosion-resistant.

While the present invention has been described in connection with the preferred embodiments, the present invention provides various advantages as follows.

In accordance with the present invention, it is possible to enhance accuracy with which nickel is etched according to a mask pattern. This is because nickel does not directly react with CO provided as an etching gas or CO generated in plasma, if a substrate were kept at −25° C. to 40° C., resulting in that a nickel film is not side-etched.

It is possible to make a nickel etching rate stable regardless of fluctuation in a substrate temperature. This is because a nickel etching rate is dependent on an ion supply rate, if a substrate were kept at 0° C. to 40° C.

It is no longer necessary to directly monitor a substrate temperature for controlling thereof. The reason is as follows. If a substrate holder were kept at about 0° C., it would be possible to keep a substrate at 40° C. or lower, even if a substrate temperature were raised while a nickel film is being etched, resulting in that a nickel etching rate could be kept constant.

The use of a mixture gas of CO and $CO_2$ as an etching gas makes it possible to carry out nickel etching at a higher rate. This is because CO gas itself acts as an etchant.

The use of a mixture gas of CO, $CO_2$ and $H_2$ as an etching gas makes it possible to carry out nickel etching at a higher rate. This is because CO gas itself acts as an etchant, and reduction in an etching rate caused by oxidation at a surface of a nickel film is suppressed. It is possible to use a photorcsist film as a mask. The reason is as follows. Since O and $O_2$ generated by decomposition of CO and $CO_2$ in plasma react with $H_2$ to thereby make $H_2O$, and the thus generated $H_2O$ is exhausted, a photoresist film is difficult to be etched, resulting in that a greater etching selectivity with nickel is obtained. It is also possible to etch a nickel film with high accuracy. The reason is as follows. Since O and $O_2$ generated by decomposition of CO and $CO_2$ in plasma react with $H_2$ to thereby make $H_2O$, and the thus generated $H_2O$ is exhausted, a photoresist film is not side-etched.

The use of a mixture gas of CO and $H_2$ as an etching gas makes it possible to use a photoresist film as a mask. The reason is as follows. Since O and $O_2$ generated by decomposition of CO in plasma react with $H_3$ to thereby make $H_2O$, and the thus generated $H_2$ O is exhausted, a photoresist film is difficult to be etched, resulting in that a greater etching selectivity with nickel is obtained. It is also possible to etch a nickel film with high accuracy. The reason is as follows. Since O and $O_2$ generated by decomposition of CO in plasma react with $H_2$ to thereby make $H_2O$, and the thus generated $H_2O$ is exhausted, a photoresist film is not side-etched. In addition, a nickel film can be etched with less damage to an underlying substrate. The reason is as follows, Since there is no $CO_2$ gas, it is not necessary to decompose $CO_2$ gas into CO and O, which ensures that a nickel film can be etched with lower discharge power. As a result, ion radiation energy to be radiated to a substrate can be made small sufficient not to cause a damage to an underlying substrate.

In addition, it is possible to prevent an exhaust pump from being polluted with deadly poisonous nickel carbonyl $Ni(CO)_4$. The reason is as follows. An apparatus for removing toxic material in accordance with the present invention, such as the $Ni(CO)_4$ removal apparatus 32 illustrated in FIG. 10, is disposed upstream of an exhaust pump system such as the exhaust pump system 33 illustrated in FIG. 10, or upstream of a secondary pump employing oil which is readily polluted, such as the secondary pump 65 illustrated in FIG. 12. Thus, an exhaust gas to be introduced into the exhaust pump system or the secondary pump is ensured not to contain deadly poisonous nickel carbonyl $Ni(CO)_4$.

Furthermore, there is never produced solid waste containing toxic material therein. This is because deadly poisonous nickel carbonyl $Ni(CO)_4$ is decomposed into non-toxic nickel powder and combustible CO gas.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-304629 filed on Nov. 15, 1996 including specification, claims, drawings and summary is incorporated herein by reference in its entirety.

What is claimed is:

1. An apparatus for making exhaust gas non-toxic, comprising:
   (a) an exhaust pump for discharging exhaust gas out of an etching apparatus; and
   (b) a device disposed upstream of said exhaust pump, but downstream of said etching apparatus for selectively removing nickel carbonyl from said exhaust gas, and introducing a gas including no nickel carbonyl to said exhaust pump.

2. The apparatus as set forth in claim 1, wherein said exhaust pump is a pump employing oil.

3. The apparatus as set forth in claim 1, further comprising a secondary exhaust pump disposed downstream of said etching apparatus, but upstream of said device.

4. The apparatus as set forth in claim 3, wherein said secondary exhaust pump is a dry pump employing no oil.

5. The apparatus as set forth in claim 3, wherein said exhaust pump is a pump employing oil.

6. An apparatus for making exhaust gas non-toxic, comprising:
   (a) an exhaust pump for discharging exhaust gas out of an etching apparatus; and
   (b) a device disposed upstream of said exhaust pump, but downstream of said etching apparatus for selectively removing nickel carbonyl from said exhaust gas, for thermally decomposing nickel carbonyl into nickel and carbonyl, and capturing only nickel.

7. The apparatus as set forth in claim 6, wherein said exhaust pump is a pump employing oil.

8. The apparatus as set forth in claim 6, further comprising a secondary exhaust pump disposed downstream of said etching apparatus, but upstream of said device.

9. The apparatus as set forth in claim 8, wherein said secondary exhaust pump is a dry pump employing no oil.

10. The apparatus as set forth in claim 8, wherein said exhaust pump is a pump employing oil.

11. The apparatus as set forth in claim 6, wherein said device includes a heater for heating said exhaust gas.

12. The apparatus as set forth in claim 11, wherein said heater keeps said exhaust gas at a temperature in the range of 150° C. to 250° C. both inclusive.

13. The apparatus as set forth in claim 12, wherein said heater keeps said exhaust gas at a temperature of about 200° C.

14. The apparatus as set forth in claim 11, wherein said heater is disposed outside a chamber in which said exhaust gas flows, said heater heating said exhaust gas through a wall of said chamber.

15. The apparatus as set forth in claim 6, wherein said device includes a magnetic field generator for magnetically capturing nickel.

16. The apparatus as set forth in claim 15, wherein said magnetic field generator comprises at least one magnetic fin disposed inside a chamber in which said exhaust gas flows.

17. The apparatus as set forth in claim 15, wherein said magnetic field generator is disposed outside a chamber in which said exhaust gas flows, said magnetic filed generator magnetically attracting nickel onto an inner wall of said chamber.

* * * * *